(12) United States Patent
Deng et al.

(10) Patent No.: US 6,759,859 B2
(45) Date of Patent: Jul. 6, 2004

(54) RESILIENT AND RUGGED MULTI-LAYERED PROBE

(75) Inventors: Joseph D. S. Deng, Taoyuan (TW); Hong-Chyi Lee, Taotuan Hsien (TW)

(73) Assignee: Chung-Shan Institute of Science and Technology, Taoyuan (TW)

( * ) Notice: Subject to any disclaimer, the term of this patent is extended or adjusted under 35 U.S.C. 154(b) by 0 days.

(21) Appl. No.: 10/033,749

(22) Filed: Dec. 19, 2001

(65) Prior Publication Data

US 2003/0112024 A1 Jun. 19, 2003

(51) Int. Cl.⁷ .................. G01R 31/02; G01R 31/26; H01H 31/02
(52) U.S. Cl. .................. 324/754; 324/537; 324/765
(58) Field of Search .................. 324/754, 537, 324/765

(56) References Cited

U.S. PATENT DOCUMENTS

| | | | | |
|---|---|---|---|---|
| 3,596,228 A | * | 7/1971 | Reed, Jr. et al. | 324/537 |
| 4,697,143 A | | 9/1987 | Lockwood et al. | 324/754 |
| 4,764,723 A | * | 8/1988 | Strid | 324/765 |
| 4,827,211 A | * | 5/1989 | Strid et al. | 324/754 |
| 4,853,627 A | * | 8/1989 | Gleason et al. | 324/754 |
| 4,998,062 A | * | 3/1991 | Ikeda | 324/754 |
| 5,373,231 A | * | 12/1994 | Boll et al. | 324/537 |
| 5,506,515 A | | 4/1996 | Godshalk et al. | 324/754 |

OTHER PUBLICATIONS

"Rugged Probe Design Delivers Mic Measurements" Markku Jenu / VTI Information Technology / Design Feature, Jun. 1995 / p. 104, 106 and 109.

* cited by examiner

Primary Examiner—Kamand Cuneo
Assistant Examiner—Jermele M. Hollington
(74) Attorney, Agent, or Firm—J.C. Patents (57) ABSTRACT

A resilient and rugged probe, used to measure an on-wafer signal. The probe has a metal probe tip, a resilient soft multi-layered dielectric substrate, a planar transmission structure and a fixed end. The probe tip is connected to the planar transmission structure. The planar transmission structure is attached to and supported by the resilient soft multi-layered dielectric substrate and then connected to the fixed end.

4 Claims, 8 Drawing Sheets

RESILIENT AND RUGGED MULTI-LAYERED PROBE

BACKGROUND OF THE INVENTION

1. Field of the Invention

The invention relates in general to a probe, and more particularly, to a resilient and rugged probe used to measure microwave and high-speed signals on a wafer.

2. Description of the Related Art

In addition to the printed circuit board (PCB), the versatile applications of microwave and high-speed signal circuit further include the hybrid circuit, the multi-chip module (MCM), and the integrated circuit (IC). For the microwave circuit and the high-speed signal circuit, the most accurate and convenient measurement methods include on-wafer measurement. To obtain an accurate measurement result, a good probe is required.

The technique of probe used for on-wafer measurement has been disclosed in U.S. Pat. No. 4,697,143 in September 1989. This invention of "Wafer Probe" issued to Larry R. Lockwood et al. is a probe made with $Al_2O_3$ substrate for signal measurement. The measured signal is transmitted through the transmission line on the substrate to a planar-coaxial cable converter, and is then output to a measurement instrument. In U.S. Pat. No. 4,697,143, the microwave probe has a planar probing structure for signal transmission fabricated on the hard $Al_2O_3$ substrate. Such structure is used to probe the object to be measured. In addition to a probe tip, the signal is transmitted along a signal transmission planar structure on the $Al_2O_3$ substrate through the probe tip to the coaxial transmission structure. The signal transmission medium made of $Al_2O_3$ has the characteristics of high microwave transmission quality and low transmission loss. However, as the supporting substrate is made of a hard material, the angle of depression between the probe and the object to be measured and the downward pressure applied to the probe is strictly specified during measurement. Therefore, the probe tip has to be held parallel to the object to be measured. Further, a limited range of pressure is applied to the probe while touching the object to avoid damaging the probe.

Later in April 1996, Edward M. Godshalk disclosed "high-frequency probe tip assembly" in the U.S. Pat. No. 5,506,515. The probe tip has a claw shape to probe a planar transmission structure, so as to allow measuring a non-planar object. A planar-coaxial converter is adjacent right behind the probe to output the signal to the measurement instrument thereby. In U.S. Pat. No. 5,506,515, the microwave probe tip has one end made of metal in a claw shape and the other end in the form of a coaxial signal cable. Without a supporting medium and the resilience thereof, the claw-shape tip of the microwave probe can be shifted up and down within a limited range for measuring an object with an uneven or non-planar surface. The problems of the angle of suppression and the downward pressure are thus partially resolved. However, the angle of suppression for probing the object is still limited by the parameters of length and pitch of the probe tip. That is, the longer is the tip, the bigger is the angle tolerance and the larger is the pitch and the smaller is the angle tolerance.

Further in June 1996, Markku Jenu disclosed "rugged probe design MIC measurement" in the Microwave & RF (Radio Frequency) magazine. A soft substrate is incorporated as the supporting material for the probe tip and the signal transmission planar structure. Such substrate allows the probe tip having angle difference (angle of suppression, angle of elevation) with the object to be measured. In this disclosure, substrates made of different materials (with different dielectric constants) are laminated into a composite substrate, of which a layer with a higher dielectric constant is harder and used as the dielectric for signal transmission planar structure, and another layer with a lower dielectric constant is softer and used for supporting and providing resilience. The probe tip and the signal transmission planar structure are all on the composite substrate. As the whole structure has the resilient characteristics, the probe is resilient and twistable during measurement. The tolerance of the angles of suppression and elevation of the probe tip for measuring the object is increased. However, being formed on the composite substrate, the probe tip cannot be moved up and down separately. It is thus not applicable for object with an uneven surface.

SUMMARY OF THE INVENTION

The invention provides a resilient and rugged probe. A soft and resilient high-frequency substrate and a suspended claw-shape probe tip are incorporated to resolve the unevenness problems of the circuit substrate and the poor surrounding planarity. The accuracy and reproducibility for measurement can thus be ensured.

The invention provides a resilient and rugged probe to measure the on-wafer signal. The probe has a metal probe tip, a resilient soft multi-layered dielectric substrate, a planar transmission structure and a fixed end. The probe tip is connected to the planar transmission structure. The planar transmission structure is attached to and supported by the resilient soft multi-layered dielectric substrate, and then is connected to the fixed end.

In one embodiment of the invention, the metal probe tip is used to probe the signal of the wafer. Further, the metal tip is able to rotate about an axis with a specific angle and to lift or dive as required.

In another embodiment of the invention, the fixed end supports and holds the probe, and is used as a transmission structure converter of the probe to connect the planar transmission structure to the coaxial transmission structure.

The invention further provides a resilient and rugged probe to measure signals on wafer. The probe has a probe tip, a planar transmission structure and a multi-layered dielectric material. The probe tip is connected to the planar transmission structure. The multi-layered dielectric substrate supports the planar transmission structure. Devices can be embedded into the multi-layered dielectric material. The devices include multi-layered microwave circuits, vertical connectors, bias circuits, or matching circuit devices.

In a further embodiment of the invention, the probe tip is protrusive to probe the signal of the substrate. In addition, the metal probe tip can rotate around an axis with a specific angle and can dive and lift.

The invention further provides a resilient and rugged probe to measure signals on wafer. The probe has a probe tip, a connector and a multi-layered dielectric material. The connector is attached to the fixed end to couple the signals from the probe to measurement instruments. The multi-layered dielectric substrate supports the planar transmission structure. Devices can be embedded into the multi-layered dielectric material. The devices include multi-layered microwave circuit, vertical connector or matching circuit device.

In yet another embodiment of the invention, the probe tip is protrusive to probe the signal of the substrate. In addition, the probe tip can rotate around an axis with a specific angle and can dive and lift.

Accordingly, the probe provided by the invention can be bent to a configuration conformal to the measuring object, and the probe can apply pressure to the probe tip to provide the advantages of high measurement repeatability, operation convenience and ruggedness.

Both the foregoing general description and the following detailed description are exemplary and explanatory only and are not restrictive of the invention, as claimed.

DESCRIPTION OF THE PREFERRED EMBODIMENTS

Figure 1A:
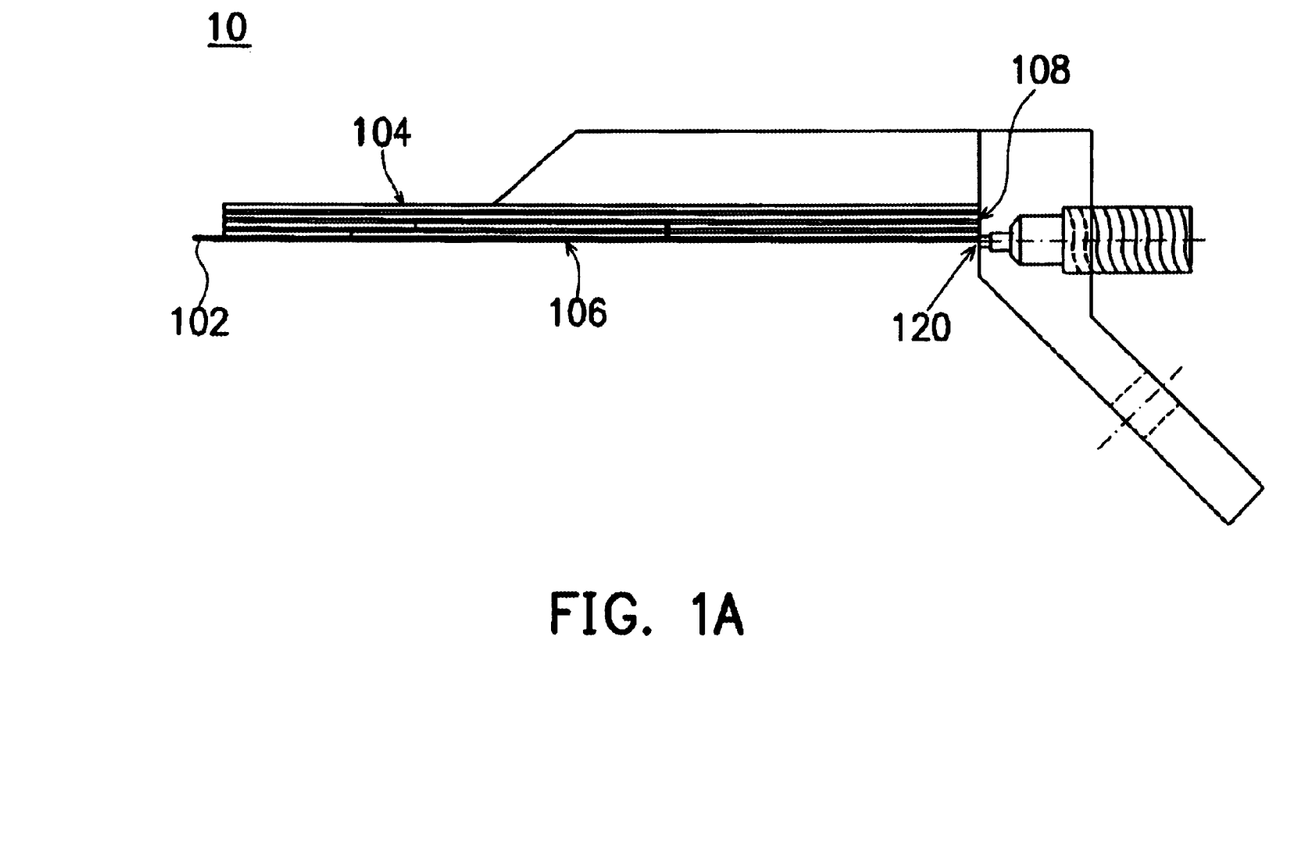
FIG. 1A shows a side view of an embodiment of a resilient and rugged probe provided by the present invention.
Figure 1B:
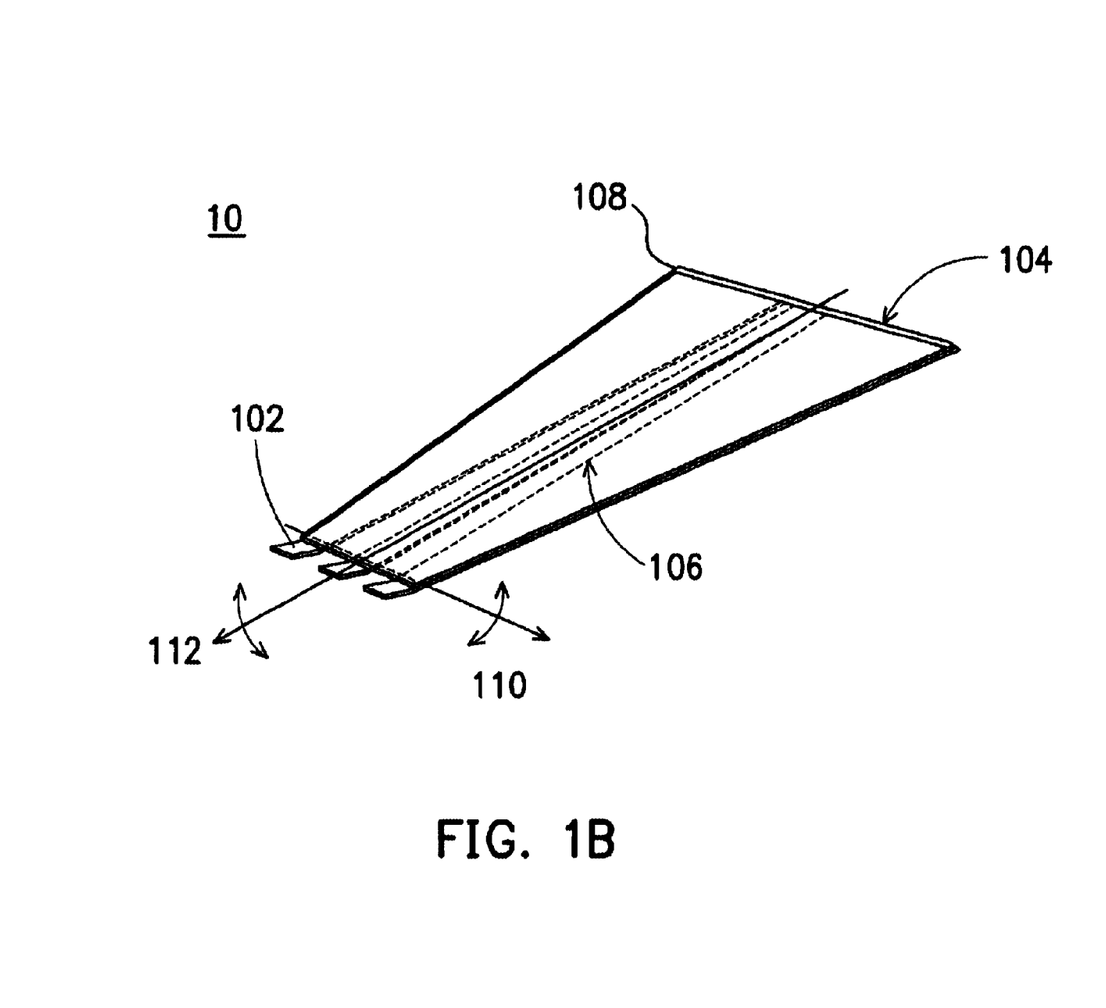
FIG. 1B shows movements of the resilient and rugged probe.
Figure 1C:
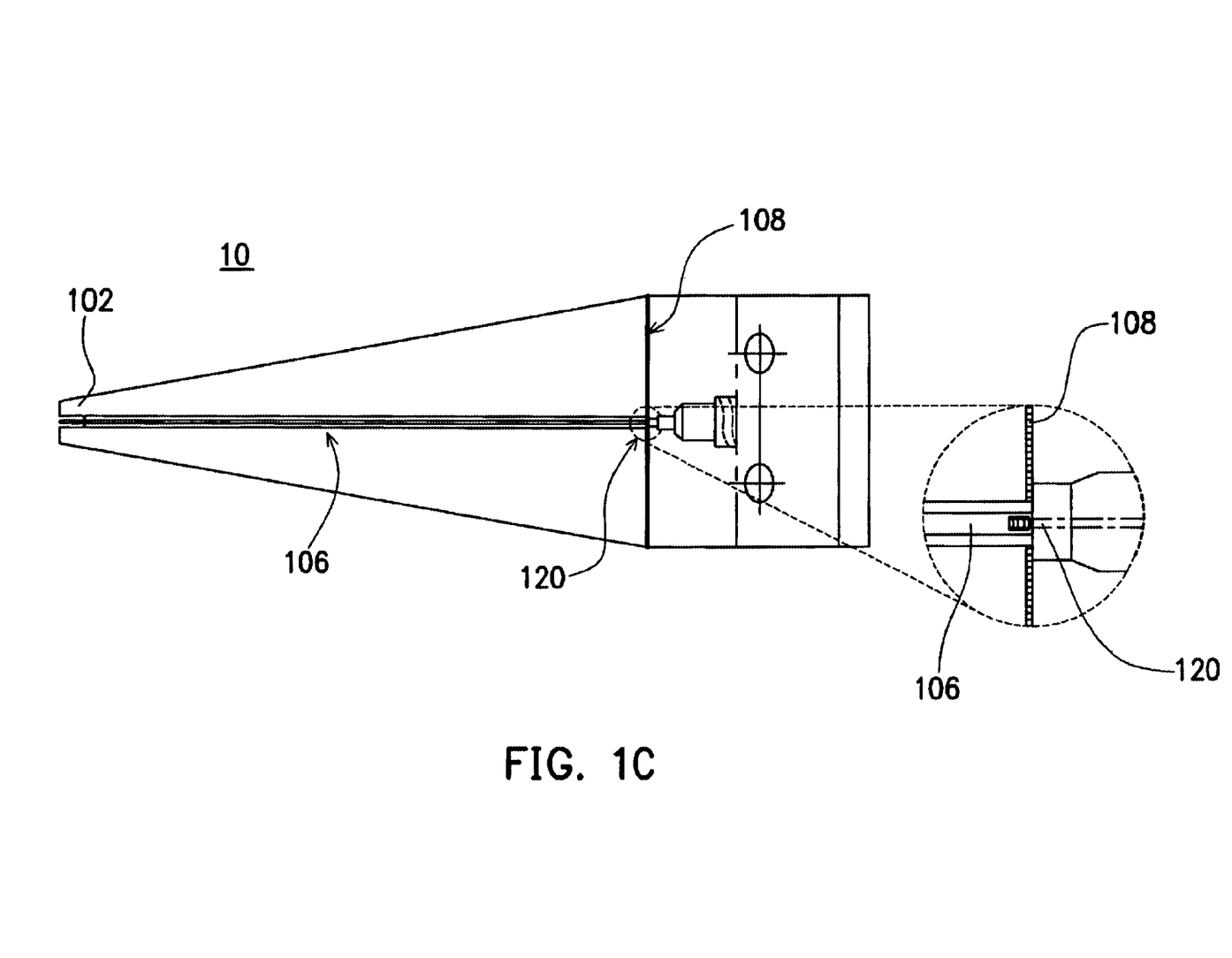
FIG. 1C is a bottom view of the resilient and rugged probe.

Referring to FIG. 1A, the structure of a resilient and rugged probe in one embodiment is shown. The probe 10 is used to measure the on-wafer signal. In FIG. 1A, the probe 10 includes a metal probe tip 102, a resilient soft multi-layered dielectric substrate 104, a planar transmission structure 106, and a fixed end 108 for supporting the probe 10. The metal probe tip 102 extends outward and suspends from the planar transmission structure into the surrounding air and has a claw shape. The probe tip 102 can move up and down and rotate within a limited range while measuring an uneven or non-planar object. The object can then be probed and measured. The planar transmission structure 106 is coupled to the metal probe tip 102 and attached to the resilient soft multi-layered dielectric substrate 104. The fixed end 108 is coupled to the resilient soft multi-layered dielectric substrate 104 and the planar transmission structure 106 to support and hold the probe 10, and functions as a transmission structure converter of the probe to collect the planar transmission structure 106 and the coaxial transmission structure 120. As shown in FIG. 1C, the coaxial transmission structure 120 is clearly illustrated from the bottom view of the probe 10 and an expanded view of the coaxial transmission structure 120 is shown on the right side. Since the probe 10 is made of metal material and multi-layered soft dielectric material, the far end of the fixed end 108, that is, the metal probe tip 102, allows movement of rotating 110 with an angle $\phi$ and diving and lifting 112 with an anile $\phi$, as shown in FIGS. 2 and 4 respectively.

Figure 2:
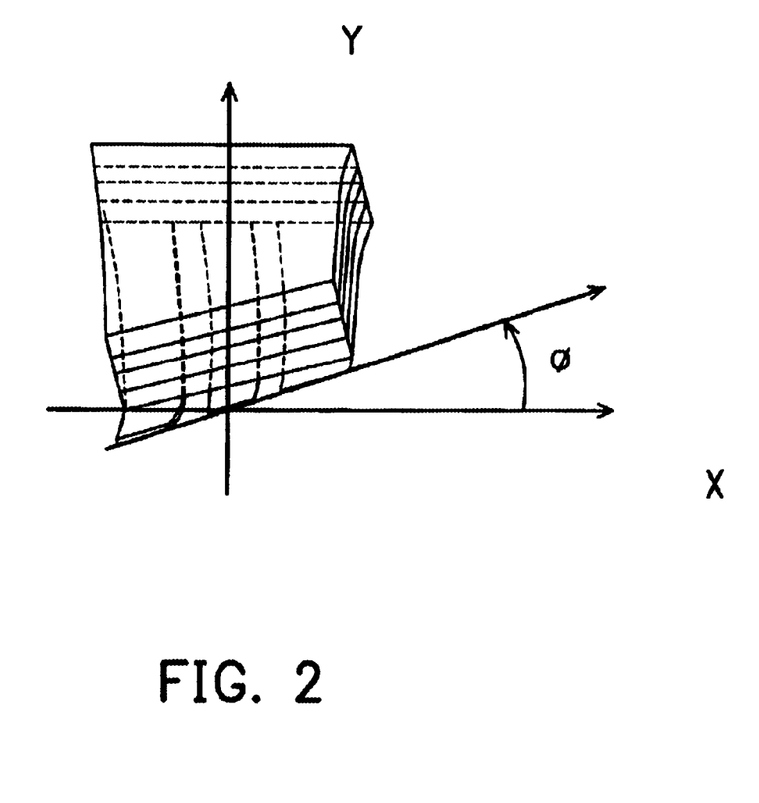
FIG. 2 shows the configuration conformity of the resilient and rugged probe in one embodiment of the invention.

FIG. 2 shows the configuration conformity of a resilient and rugged probe of the invention. The resilience of the probe 10 allows the probe 10 to be bent while probing the signal of the substrate, or example, a microwave signal, and also allows applying pressure to the metal probe tip 102. Such configuration conformity gives the operator great convenience since the object with unevenness to a certain degree can be measured.

Figure 3:
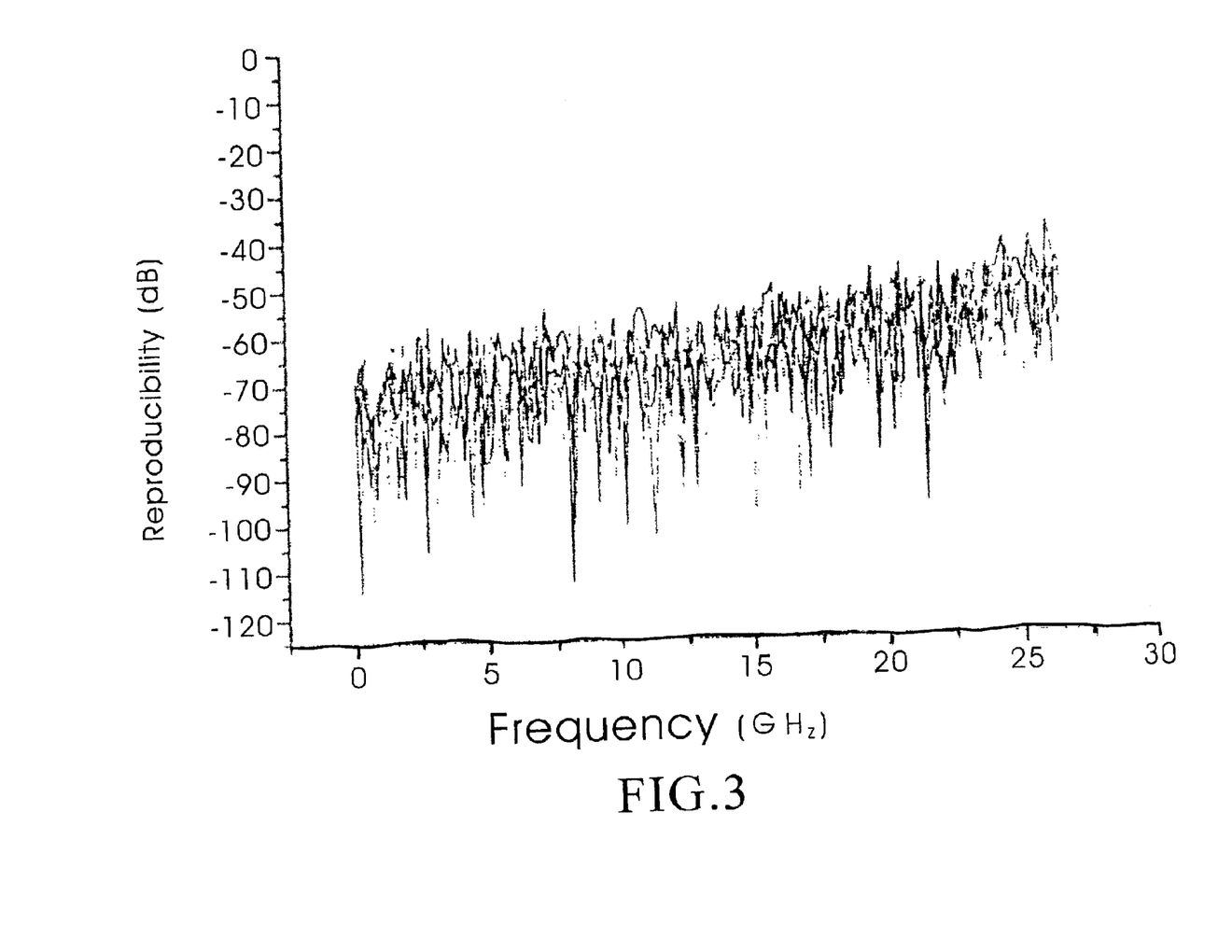
FIG. 3 shows the contact repeatability vs. frequency graph of measurement result using the resilient and rugged probe provided by the invention.

Under the same contact state, the resilience of the probe 10 results in the same pressure with any contact angle within a tolerable range, this is the key factor for obtaining the reproducibility of the measurement using the probe 10. Referring to FIG. 3, a contact repeatability vs. frequency graph of a measurement result using the resilient and rugged probe is shown. In FIG. 3, the measurement result is obtained under a non-tilting state, an arbitrary positive tilting angle and an arbitrary negative tilting angle. When the contact reproducibility is −40 dB even when frequency is as high as 26.5 GHz (The error is about 0.3%, which is minor error for microwave network measurement).

Figure 4:
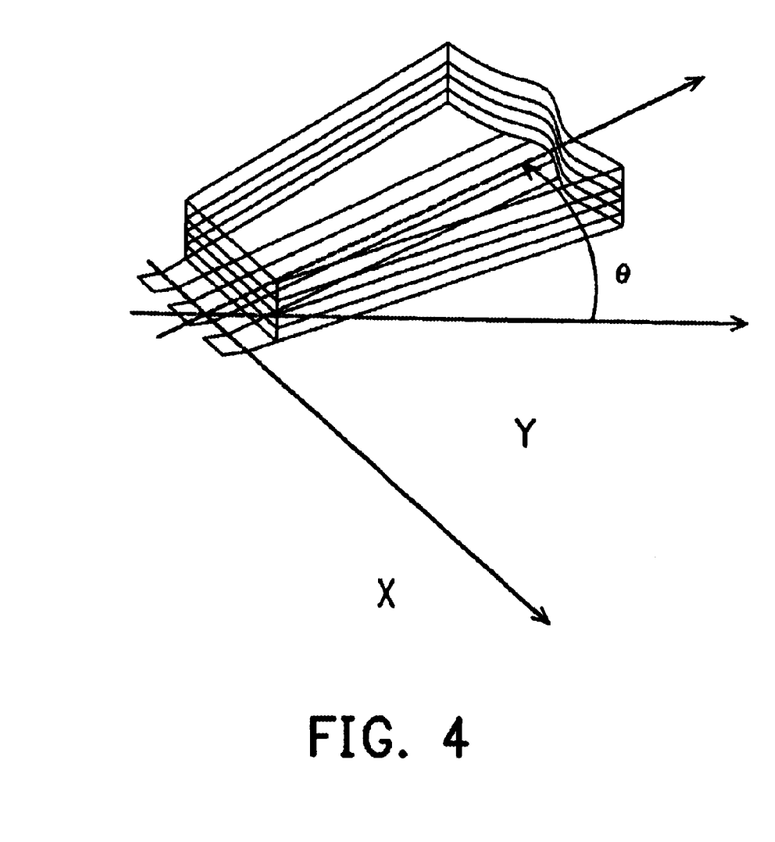
FIG. 4 shows another embodiment of a resilient and rugged probe of the invention.
Figure 5A:
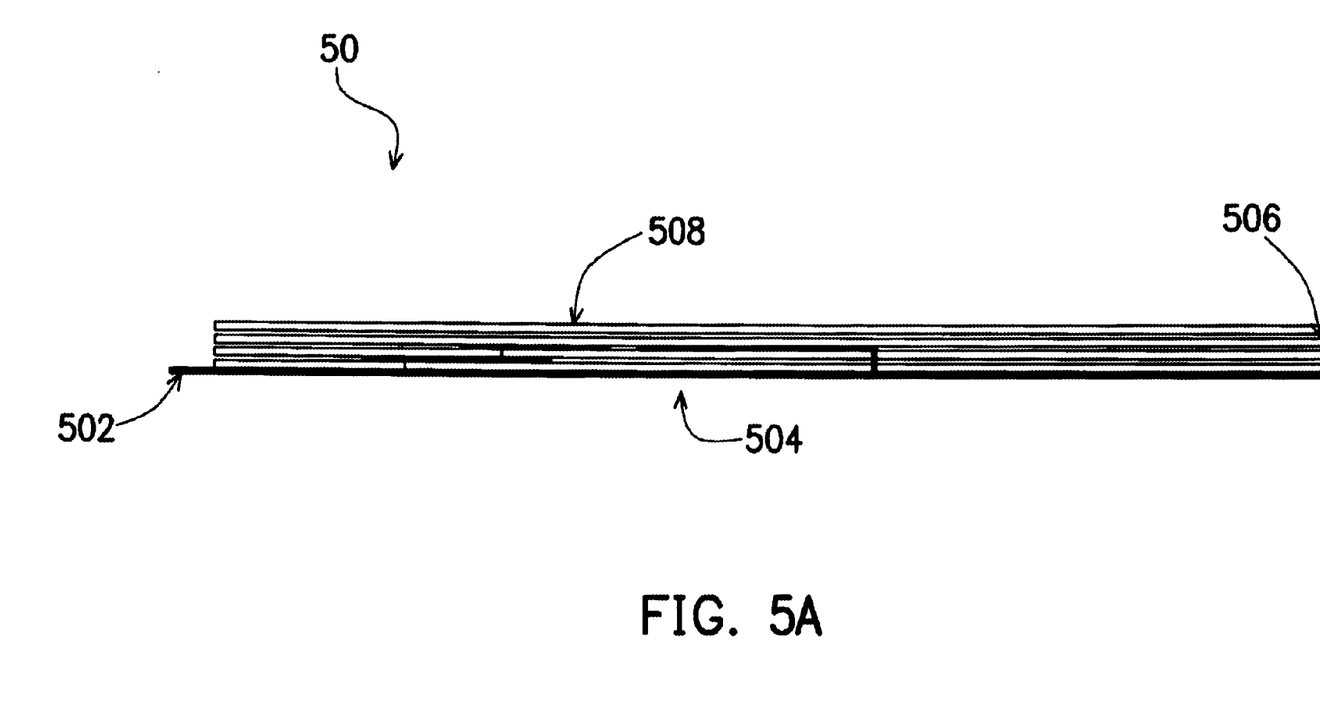
FIG. 5A is a cross sectional view showing a resilient and rugged probe in another embodiment.
Figure 5B:
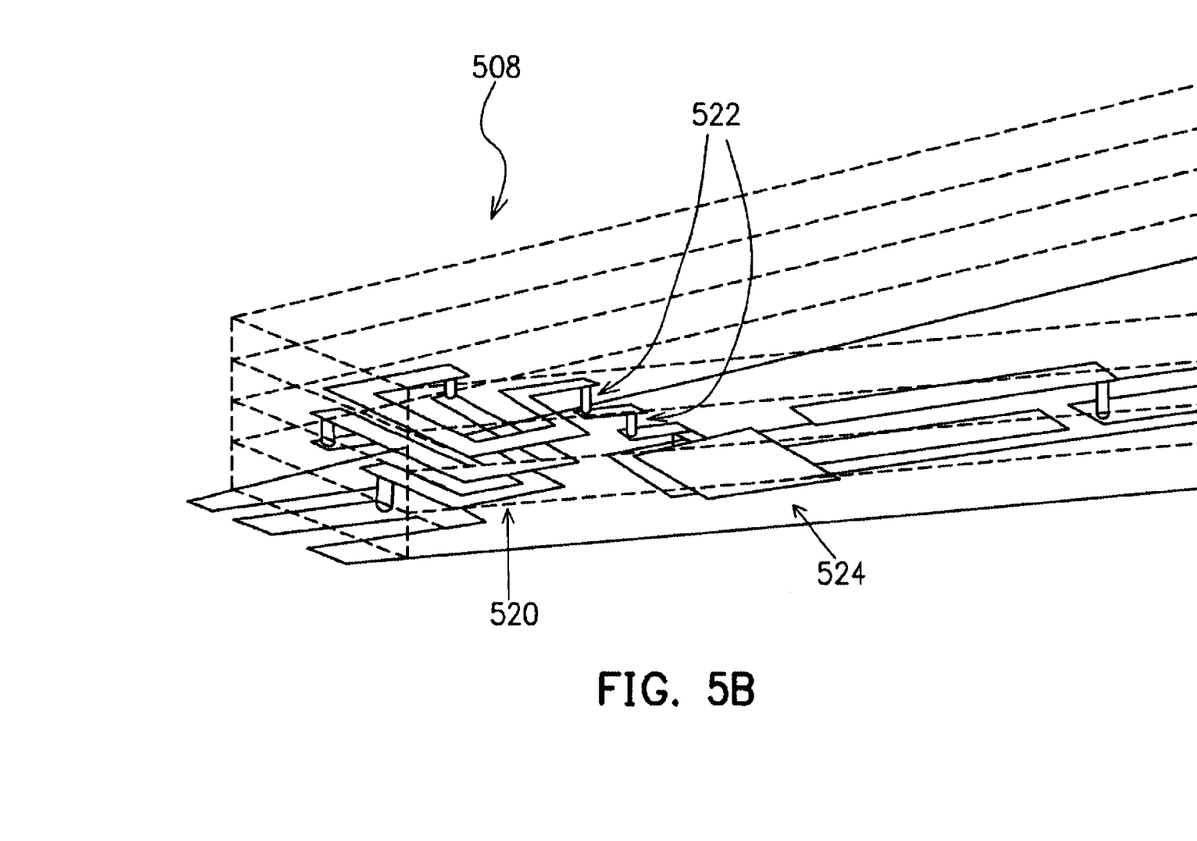
FIG. 5B is a bottom view of the resilient and rugged probe.

FIG. 4 shows the structure of another embodiment of a resilient and rugged probe. FIG. 5A shows the cross-sectional view of the resilient and rugged probe. In FIG. 5A, the probe 50 includes a probe tip 502, a planar transmission structure 504, and a multi-layered dielectric material 506. The probe tip 502 extends outward and freely suspends from the planar transmission structure into the surrounding air and has a claw shape. Since the probe tip 502 is not attached on the dielectric material, the object with an uneven or non-planar structure can be measured by moving the probe up and down and rotating the probe within a limited range. The planar transmission structure 504 is coupled to the probe tip 502, and can be replaced with a connector. The multi-layered dielectric material 506 is coupled to the planar transmission structure 504 and the probe tip 502. Devices 508 could be embedded into the multi-layered dielectric material 506. The device 508, as shown in FIG. 5B, includes a multi-layered microwave circuit 520, a vertical connector 522 or a matching circuit device 524. In this embodiment, the probe 50 can designed as an impedance pre-matching type of probe attached with a bias network to measure the non-system impedance matching device or module. In addition, the probe 50 can be assembled into a mixer type probe to analyze and measure the hybrid chip or device module vector network on the substrate.

Accordingly, the resilient and rugged probe can be used to resolve the problems occurring to the prior art, such as the accuracy and reproducibility problems caused by the evenness of the circuit substrate and the surrounding planarity. In addition, the resilient and rugged probe of the invention is particularly applicable to microwave and high-speed signal measurement. The advantages of the resilient and rugged probe can be concluded as follows.

1. The probe can be bent for configuration conformity.
2. Pressure can be applied to the probe tip by the probe.
3. High measurement reproducibility can be obtained.
4. Operation convenience.
5. Ruggedness.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A resilient and rugged probe, to measure an on-wafer signal, the probe comprising:

a metal probe tip;

a resilient multi-layered dielectric substrate;

a planar transmission structure, coupled to the metal probe tip and attached onto the resilient multi-layered dielectric substrate, wherein the metal probe tip extends out from the planar transmission structure without being attached to the resilient multi-layered dielectric substrate; and a fixed end, coupled to the resilient multi-layered dielectric substrate and the planar transmission structure, wherein the fixed end is used as a transmission structure converter of the probe to connect the planar transmission structure to a coaxial transmission structure.

2. The resilient and rugged probe according to claim 1, wherein the metal probe tip is used to probe the on-wafer signal.

3. The resilient and rugged probe according to claim 1, wherein the metal probe tip is able to lift and dive with a second angle.

4. The resilient and rugged probe according to claim 1, wherein the fixed end is used to support and hold the probe.

* * * * *